United States Patent [19]

McElroy

[11] Patent Number: 4,690,475
[45] Date of Patent: Sep. 1, 1987

[54] COMPUTER HARNESS ADAPTIVE TESTER

[76] Inventor: Robert C. McElroy, 1061-B Jefferson Dr., Homestead, Fla. 33034

[21] Appl. No.: 902,691

[22] Filed: Sep. 2, 1986

[51] Int. Cl.$^4$ ............................................. H01R 11/00
[52] U.S. Cl. .................................................. 439/502
[58] Field of Search .................. 339/28, 29 B, 150 B, 339/151 B, 154 A, 155 T, 156 T, 166 T

[56] References Cited

U.S. PATENT DOCUMENTS 3,890,836  6/1975  McKenzie et al. .................... 339/28

Primary Examiner—Gil Weidenfeld
Assistant Examiner—Paula Austin
Attorney, Agent, or Firm—John Cyril Malloy

[57] ABSTRACT

A computer harness adaptive tester for testing pins, wires, voltage and continuity in circuits between electronically controlled devices and an electronic control module; the devices are interconnected to the module by an electrical harness composed of a plurality of discrete insulated wires; the tester is composed of a coupler adapted to be interconnected electrically between one end of the harness and the electronic control module through a pair of jumper cables; and the coupler is connected through a secondary harness to a remote pin-out box where testing can be conveniently conducted.

4 Claims, 7 Drawing Figures

U.S. Patent  Sep. 1, 1987  4,690,475
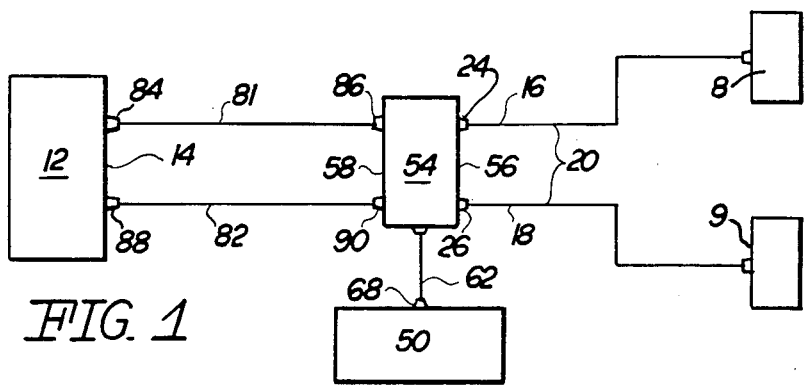
FIG. 1
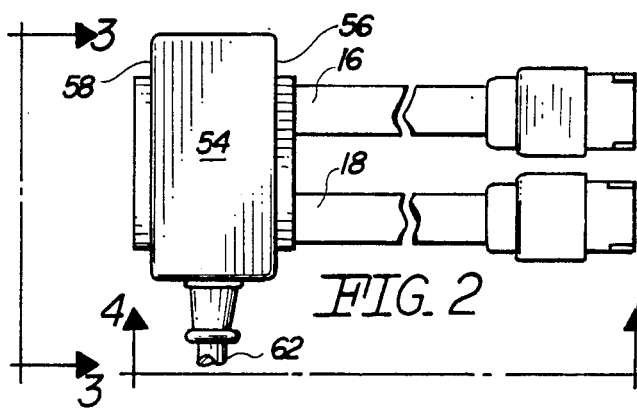
FIG. 2
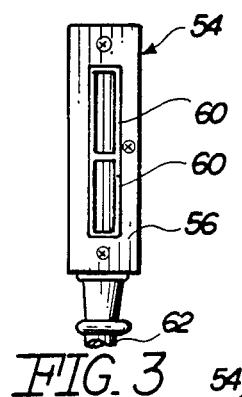
FIG. 3
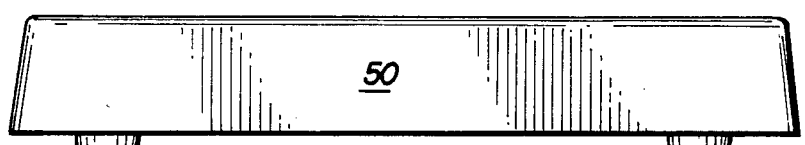
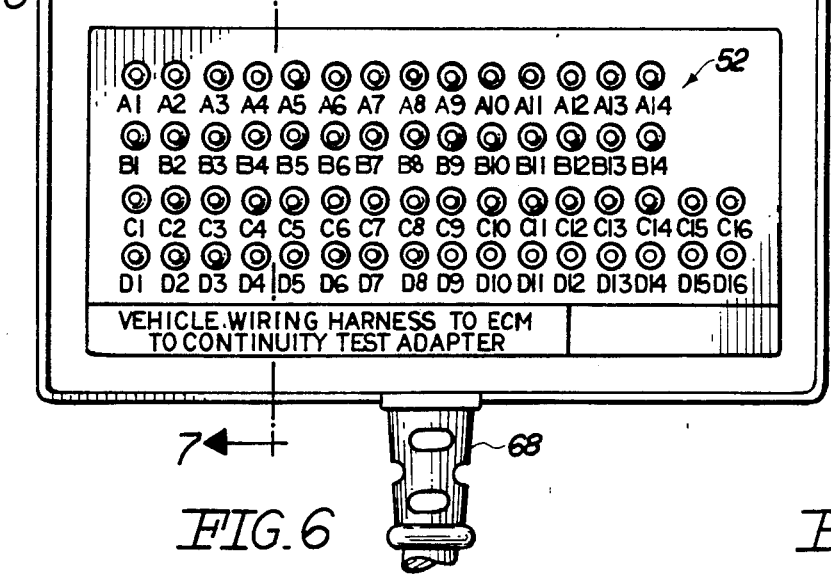
FIG. 5
FIG. 6
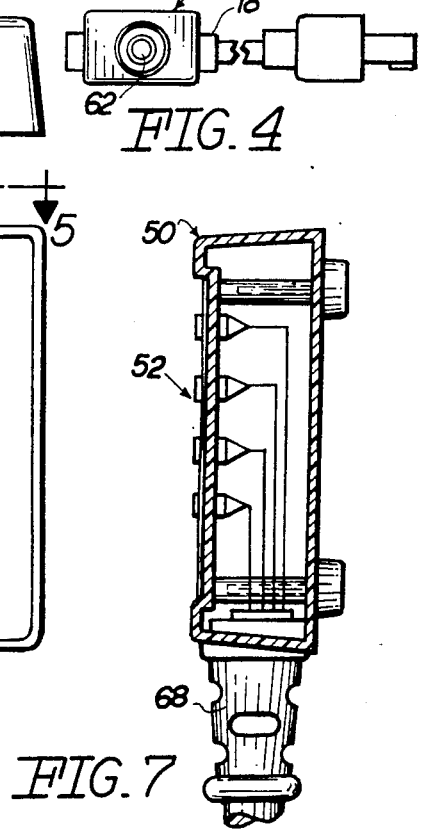
FIG. 4
FIG. 7

COMPUTER HARNESS ADAPTIVE TESTER

FIELD OF THE INVENTION

For use in checking and repairing vehicles of the type having an electronic control module, a computer harness adaptive tester for use in voltage and continuity testing of wires connecting controlled electrical devices on the vehicle to the electronic control module.

BACKGROUND IN THE ART

In the field of vehicle repair, on those vehicles equipped with an electronic control module it is often required to do voltage and continuity testing of wires electrically connected to the electronic control module and to various computer controlled electronic devices on the vehicle. This has often presented problems in the past, not the least of which is the access for testing of the pins of the module itself, which is often located underneath the dashboard. Also, there are often problems at the end of the electrical harness which connects to the module. The harness usually carries about 52 wires, each of which connects one of the controlled devices on the vehicle to the electronic control module through the various wires of the harness. These two, the connector at the harness end and the module pins are often at relatively inaccessible locations; or, if accessible, the same can only be tested by a person in an inconvenient contorted position. In addition, such testing which is conventional has been extremely time-consuming and not always accurate because of the foregoing.

SUMMARY OF THE INVENTION

The present invention provides a harness coupler and jumper means so that a remote pin-out box can be used to conduct testing at a convenient location, e.g., by placing the pin-out box on the fender of a vehicle. By virtue of the device described herein, the remote pin-out box may be relatively easily interconnected into the conventional circuitry of the vehicle, that is, in direct electrical connection with a pin and the associated wire circuits between the respective controlled electrical devices and the control module, so that, at the remote pin-out box, testing can conveniently take place.

OBJECTS OF THE INVENTION

It is an object of this invention to provide a computer harness adaptive tester otherwise stated an electronic control module wiring harness test adaptor, whereby testing of wires and other electrical points in a vehicle system may be tested at a remote location through the conventional use of a testing apparatus. In summary, the computer harness adaptive tester allows voltage and continuity testing of all wires attached to the electronic control module. If the computer harness adaptive tester receives the signal, then, the electronic control module will also receive the signal, when the device described more fully hereinafter has been inserted into the circuitry of the vehicle.

It is an object to provide a device of the type described wherein the electronic control module on a vehicle provided with such may be tested while at its fixed location in the vehicle through a remote conveniently located pin-out box. This is done by disconnecting the two electrical wiring harness connectors conventionally attached to the electronic control module of the vehicle and plugging those connectors into a coupler included in the computer harness adaptive tester with the air of two jumper connectors, the coupler is then connected to the electronic control module, so that the coupler is in series in the circuitry of the vehicle for temporary use in testing. From the coupler there is a secondary harness which is electrically connected to the pin-out box and this harness is of a sufficient length to provide a range within which it may be conveniently located.

It is thus an object of this invention to provide a computer harness adaptive tester which provides quick and easy access to all of the individual insulated conductors within an electrical harness interconnecting controlled devices to a vehicle electronic control module without removing the control module from the vehicle so that tests can be made under the hood or on the hood rather than upsidedown under the dashboard. With the use of this device, wires reversed in a harness are much easier to locate, vehicle service time is reduced, voltage checks can be directly compared to assembly line diagnostic link scan tool readings to verify intermittents, loose or corroded connections, difficult tests can be easily performed and better diagnosis repair and verification of driveability problems can be conducted to the end that customer satisfaction will be increased.

In accordance with these and other object which will become apparent hereinafter, the instant invention will now be described on reference to the accompanying drawings in which:

BRIEF DESCRIPTION OF THE DRAWINGS

FIG. 1 is a diagrammatic sketch of the invention;

FIG. 2 is a top view of the coupler 54 of FIG. 1;

FIG. 3 is a left-side view of the coupler seen in FIG. 2;

FIG. 4 is a view of FIG. 2 taken on the plane indicated by the line 4—4 of FIG. 2 and looking in the direction of the arrows;

FIG. 5 is a side elevation view of the pin-out box 50 of FIG. 1;

FIG. 6 is a top plan view of the pin-out box of FIG. 5; and

FIG. 7 is a side elevation view in cross-section of the pin-out box taken on the plane 7—7 of FIG. 6.

DESCRIPTION OF THE PREFERRED EMBODIMENT

As is conventional in vehicles with computer command control systems, there is an electronic control module 12 which is mounted to the vehicle. It is ordinarily located under the dashboard which is crowded with other items and hence is relatively inaccessible. The electronic control module connects to the end of a harness of individual insulated wires. The harness end has a connector means to electrically connect to a receiving means on the module. This arrangement usually includes a socket 14 into which a companionate connector means, such as 16 and 18 on the harness end are interconnected so that pins on one are received in sockets in the other to effect an electrical connection. Often the end of the harness is bifurcated into two wire bundles, thus the two connector means, 16 and 18, are located on the ends of the harness 20 as illustrated. The harness is composed of up to fifty-two wires each of which is discrete and insulated. The connector means on the ends of the two bundles, 16 and 18, are numbered 24 and 26. Thus, each of the two terminal end sections 24 and 26 is adapted to connect to the module 12, normally. In a normal use configuration, each of the electrical wires of the harness is connected to an electrical device on the vehicle so that the controlled device is controlled through the electronic control module wherein the conditions of the controlled electrical device, generally represented by the numerals 8 and 9, are sensed and controlled by the computer generally. When something is not operating effeciently or has malfunctioned, it is necessary to examine the particular wire from the many which specifically control through the computer the particular electrical function which is not operating correctly. In order to do this, a tool available to auto mechanics known as a multi-meter is usually employed. Such a tool or meter has two leads and can function either as a volt meter, amp meter, or Ohm meter. For voltage testing, one of the leads of the multi-meter is electrically connected to one of the wires and the other lead is connected to ground. The problem has been that the bifurcated terminal end of the harness on which the connector means 16 and 18 are located and the companionate receiving portion of the module are not easily accessible for the testing operation. There has been a problem because, in the past, a person repairing vehicles had to lay on his back in an uncomfortable position and in a generally contorted attitude in order to carry out relatively simple test procedures at the often encountered very difficult or almost inaccessible location.

This invention provides a remote pin-out box 50 so that the testing can proceed efficiently at a convenient location. On the pin-out box there are conveniently arranged and identified pin sockets or connector means in a pre-arranged pattern such as that indicated by the numeral 52, see FIG. 6, wherein the individual sockets are appropriately and conveniently labeled. One merely connects this device into the circuit using the means to be described hereinafter and conducts the tests using the remote pin-out box at a convenient location so that the conventional multi-meter can be used conveniently to find the information that is needed, for example, by placing the pin-out box on an autombile fender or hood.

To this end, there is provided a harness coupler 54 to be electrically connected temporarily in the vehicle circuit, that is with the harness and module. The face 56 of the coupler has a connector means receptacle to mate with the connector means 16 and 18 of the harness; these receptacles are designated by the numeral 60 in FIG. 3. To connect the coupler to the remote pin-out box 50, a secondary harness 62 is provided with a first end which is composed of a plurality of insulated wires each of which is connected electrically in the coupler to one of the conductor wires of the harness while the other end 68 is connected to the remote pin-out box 50 with each of the wires carried in the secondary harness 62 being connected to one of the pins respectively. The harness coupler 54 is also connected to the vehicle electronic control module 12 through a jumper means which is preferably composed of two jumpers 81 and 82, which are relatively short in length. On the terminal ends 84 and 86 and 88 and 90 of each jumper there are provided connector means to connect these jumpers respectively to the pins in the face 58 of the harness coupler on the one hand and to the socket 14 of the electronic control module on the other hand.

When thus installed for testing and while the vehicle is running, the computer of the electronic control module is electrically connected through each of the harness wires and coupler to the associated respective electrical apparatus of the vehicle and the remote pin-out box is also connected in each circuit so that the continuity and the voltage in each wire and the associated connector and pin of the electronic control module may be tested and monitored. The secondary harness is preferably greater than two feet in length and in a preferred embodiment is between five and fifteen feet in length, to provide a convenient range within which the pin-out box may be placed.

Thus, it is seen that there has been described a new and useful remote pin-out box for avoiding the problems heretofore encountered in the field which is simple an inexpensive to use and provides numerous advantages such as: Quick and easy access to all fifty-two electronic control module harness wires. The module does not have to be removed from the vehicle for harness tests of voltage and continuity. Tests can be made under the hood rather than upside down on technicians back under dash. Wires reversed in harness are much easier to locate. Vehicle service time is reduced. Voltage checks can be directly compared to scan tool reading to verify intermittents, loose or corroded conditions. While scanners update only every 1½ seconds, this provides immediate response. Difficult tests are now easy to perform. Technicians are better able to diagnose and repair and verify tough driveability problems. Customer satisfaction increases.

In a preferred embodiment, the coupler 54, secondary harness 62 and the pin-out box 50 constitute a single unit with the aforesaid parts, 50, 54, and 62, being electrically interconnected; also, the jumper cables 81 and 82 may be incorporated into this combination.

While the instant invention has been shown and described in what is considered to be a practical and preferred embodiment, it is recognized that departures may be made therefrom within the spirit and scope of this invention which is, therefore, not to be limited except as set forth in the claims hereinafter and in accordance with the doctrine of equivalents.

What is claimed is:

1. A computer harness adaptive tester to be electrically interconnected between (a) the end of an electrical harness, which normally connects to a module on a vehicle, and (b) the electronic control module, said adaptive tester comprising:
   (A) a coupler means, (B) a jumper means, (C) a remote pin-out box, and (D) a secondary harness interconnecting said coupler means and said remote pin-out box;
   said jumper means including means interconnecting the coupler means and said control module, and
   said secondary harness being of a length greater than two feet,
   whereby testing of wires in the vehicle circuits may be conducted at a remote location without removal of the electronic control module from the vehicle and while the tester is temporarily and electrically interconnected between the harness end and its normal connection to the module.

2. The device as set forth in claim 1 wherein the jumper means comprises two cable means each composed of a bundle of separated descrete insulated wires and each cable means having a connector means on their respective opposite ends and said coupler means and electronic control module are each provided with means configured and adapted to mate with said jumper means connector means for temporary electrical interconnection of the coupler and the electronic control module.

3. The device as set forth in claim 1 wherein the secondary harness is integrally electronically connected to the coupler and the pin-out box.

4. The device as set forth in claim 1 wherein said coupler includes a first electrical connector means to connect to a connector means on the secondary electrical harness.

* * * * *